(12) United States Patent
Wei et al.

(10) Patent No.: US 11,515,367 B2
(45) Date of Patent: Nov. 29, 2022

(54) DISPLAY APPARATUS, METHOD FOR MANUFACTURING DISPLAY APPARATUS, AND ELECTRONIC DEVICE

(71) Applicant: HUAWEI TECHNOLOGIES CO., LTD., Shenzhen (CN)

(72) Inventors: Shanshan Wei, Shanghai (CN); Yanfeng Liang, Shanghai (CN); Haohui Long, Beijing (CN); Jianhui Li, Dongguan (CN); Lin Qu, Xi'an (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 117 days.

(21) Appl. No.: 16/979,601

(22) PCT Filed: Mar. 31, 2018

(86) PCT No.: PCT/CN2018/081492
§ 371 (c)(1),
(2) Date: Sep. 10, 2020

(87) PCT Pub. No.: WO2019/183985
PCT Pub. Date: Oct. 3, 2019

(65) Prior Publication Data
US 2021/0043694 A1  Feb. 11, 2021

(51) Int. Cl.
*H01L 27/32* (2006.01)
*G06F 3/041* (2006.01)
(Continued)

(52) U.S. Cl.
CPC .......... *H01L 27/323* (2013.01); *G06F 3/0412* (2013.01); *H01L 51/56* (2013.01);
(Continued)

(58) Field of Classification Search
CPC . H01L 27/323; H01L 51/56; H01L 2227/323; H01L 27/32; H01L 27/3255;
(Continued)

(56) References Cited

U.S. PATENT DOCUMENTS 9,164,641 B1   10/2015 Lee
2012/0319967 A1   12/2012 Tsai et al.
(Continued)

FOREIGN PATENT DOCUMENTS

CN   102833944 A   12/2012
CN   103971604 A   8/2014
(Continued)

*Primary Examiner* — Grant Sitta
(74) *Attorney, Agent, or Firm* — Maier & Maier, PLLC

(57) ABSTRACT

An electronic device and a method for manufacturing the display apparatus. The electronic device includes a display apparatus and a processor, wherein the display apparatus includes an active-matrix organic light emitting diode (AMOLED) panel, a touch panel, a chip IC, and a printed circuit board. The touch panel is disposed on an upper surface of the AMOLED panel, and the touch panel and the AMOLED panel each has an outgoing line. The outgoing line of the touch panel and the outgoing line of the AMO-LED panel are separately extended to form an outgoing line extension end of the touch panel and an outgoing line extension end of the AMOLED panel. The outgoing line extension end of the AMOLED panel and the outgoing line extension end of the touch panel are electrically connected to the printed circuit board PCB by using the chip IC.

12 Claims, 11 Drawing Sheets

(51) Int. Cl.
*H01L 51/56* (2006.01)
*H05K 1/18* (2006.01)

(52) U.S. Cl.
CPC ... *H05K 1/189* (2013.01); *G06F 2203/04103* (2013.01); *H01L 2227/323* (2013.01); *H05K 2201/10128* (2013.01)

(58) Field of Classification Search
CPC ............... H01L 27/3276; G06F 3/0412; G06F 2203/04103; G06F 1/1637; G06F 3/041; G06F 3/0416; H05K 1/189; H05K 2201/10128; H05K 1/147; H04M 2250/22; H04M 1/0277; H04M 1/0266
See application file for complete search history.

(56) References Cited

U.S. PATENT DOCUMENTS

| | | | |
|---|---|---|---|
| 2013/0016049 A1 | 1/2013 | Eom et al. | |
| 2013/0314883 A1* | 11/2013 | Ling | H05K 7/026 361/749 |
| 2015/0230337 A1* | 8/2015 | Kim | H05K 1/118 29/830 |
| 2016/0278201 A1* | 9/2016 | Cheon | H01L 27/3272 |
| 2017/0263891 A1* | 9/2017 | Oh | H01L 51/5284 |
| 2019/0095007 A1* | 3/2019 | Jeong | G06F 1/1637 |
| 2019/0121394 A1* | 4/2019 | Lang | G02B 6/0091 |
| 2019/0348357 A1* | 11/2019 | Lee | H01L 23/4985 |
| 2019/0361551 A1* | 11/2019 | Lius | G06F 3/1446 |

FOREIGN PATENT DOCUMENTS

| | | |
|---|---|---|
| CN | 106445224 A | 2/2017 |
| CN | 106648209 A | 5/2017 |
| CN | 106847868 A | 6/2017 |
| CN | 106910429 A | 6/2017 |
| CN | 107025014 A | 8/2017 |
| CN | 107180848 A | 9/2017 |
| CN | 107180850 A | 9/2017 |
| CN | 206541282 U | 10/2017 |
| CN | 107393422 A | 11/2017 |
| CN | 107466158 A | 12/2017 |
| CN | 109906403 A | 6/2019 |
| JP | 2001100238 A | 4/2001 |
| JP | 2017097163 A | 6/2017 |
| JP | 2017111437 A | 6/2017 |
| KR | 1020150079265 A | 7/2015 |
| KR | 20150088825 A | 8/2015 |
| KR | 1020160113352 A | 9/2016 |
| KR | 1020170106589 A | 9/2017 |

\* cited by examiner

DISPLAY APPARATUS, METHOD FOR MANUFACTURING DISPLAY APPARATUS, AND ELECTRONIC DEVICE

CROSS-REFERENCE TO RELATED APPLICATIONS

This application is a national stage of International Application No. PCT/CN2018/081492, filed on Mar. 31, 2018, which is hereby incorporated by reference in its entirety.

TECHNICAL FIELD

This application relates to the field of electronic product technologies, and in particular, to a display apparatus, a method for manufacturing the display apparatus, and an electronic device.

BACKGROUND

A curved screen mobile phone leads a trend of an appearance design, and a folding screen mobile phone is a focus in the near future. A display technology represented by organic light-emitting diode (OLED) flexible display emerges accordingly and is quickly developing. OLED display technology has advantages such as self-luminescence, a wide viewing angle, an almost infinitely high contrast, relatively low power consumption, and a very fast reaction speed. The OLED display technology is a prominent technology in a contemporary display field, and is widely applied to products such as a smartphone, a tablet computer, a wearable device, and an in-vehicle display. A flexible substrate and thin film encapsulation (TFE) are used to implement bending of a display screen, and gradually implement curling and flexing. A circuit connection design of a flexible display is different from COG (chip on glass) and FOG (film on glass) processes of a hard display. In the circuit connection design of the flexible display, a flexible panel substrate is connected to COF (chip on film) by using a FOF (film on film) process, a chip (integrated circuit, IC) forms the COF by using an Au—Sn eutectic and a flexible printed circuit (FPC), the COF is connected to a main FPC by using the FOF process, and finally is connected to a mainboard by using a board-to-board (BTB) connector, and a touch panel FPC connects a touch panel film to the main FPC by performing the FOF process twice.

Currently, for a commonly used display apparatus (as shown in FIG. 1), two FPCs are usually required to separately route drive lines of the touch panel and an active organic light emitting diode (active-matrix organic light emitting diode, AMOLED) panel, and an output end connects the touch panel and the AMOLED panel in parallel by using another FPC, to centrally route the drive lines to a functional board such as a printed circuit board (PCB). However, three FPCs, a panel, and a mainboard are connected by performing the FOF process four times, the COF once, and the BTB once. A large quantity of components are used, resulting in a low yield rate and high costs.

SUMMARY

Embodiments may provide a display apparatus, a method for manufacturing the display apparatus, and an electronic device, so as to resolve a problem in the related art that a relatively large quantity of components are used to manufacture a display apparatus, resulting in a low yield rate and high costs.

According to a first aspect, an embodiment provides a display apparatus. The display apparatus may include: an AMOLED panel, a touch panel, an IC, and a PCB. The touch panel is disposed on an upper surface of the AMOLED panel, and the touch panel and the AMOLED panel each have an outgoing line. The outgoing line of the touch panel and the outgoing line of the AMOLED panel are separately extended to form an outgoing line extension end of the touch panel and an outgoing line extension end of the AMOLED panel. The outgoing line extension end of the AMOLED panel and the outgoing line extension end of the touch panel are electrically connected to the PCB by using the IC. The IC is configured to drive the display apparatus to display a picture.

Compared with the related art, the display apparatus in this embodiment reduces two independent FPCs, one COF connector, and one BTB. This greatly reduces costs. In addition, because a flexible bending panel has a smaller bending radius, a width of a frame of the display apparatus is further reduced, and user experience is improved.

In a possible embodiment, that the outgoing line extension end of the AMOLED panel and the outgoing line extension end of the touch panel are electrically connected to the PCB by using the IC includes: The outgoing line extension end of the AMOLED panel and the outgoing line extension end of the touch panel are respectively connected to a first surface and a second surface of the IC, and the outgoing line extension end of the AMOLED panel or the outgoing line extension end of the touch panel is connected to the PCB. The touch panel and the AMOLED panel are integrated by using the IC, and are centrally routed out to connect to the PCB, so that the IC has a logical integration function of display and touch, and improves user experience.

In a possible embodiment, the IC includes a first IC and a second IC. That the outgoing line extension end of the AMOLED panel and the outgoing line extension end of the touch panel are electrically connected to the PCB by using the IC includes: The outgoing line extension end of the AMOLED panel is connected to the first IC and the PCB, and after the outgoing line extension end of the touch panel is connected to the second IC and the outgoing line extension end of the AMOLED panel, the outgoing line extension end of the touch panel is electrically connected to the PCB by using the outgoing line extension end of the AMOLED panel; or the outgoing line extension end of the touch panel is connected to the second IC and the PCB, and after the outgoing line extension end of the AMOLED panel is connected to the first IC and the outgoing line extension end of the touch panel, the outgoing line extension end of the AMOLED panel is electrically connected to the PCB by using the outgoing line extension end of the touch panel.

According to a second aspect, an embodiment provides a display apparatus. The display apparatus may include an AMOLED panel, a touch panel, an IC, and a PCB. The touch panel is integrated on an upper surface of the AMOLED panel, and the IC is separately connected to an outgoing line extension end of the AMOLED panel and the PCB. The IC is configured to drive the display apparatus to display a picture.

According to the display apparatus in this embodiment, the touch panel is integrated on the upper surface of the AMOLED panel, and the outgoing line of the touch panel does not need to be folded. This reduces a width of a frame of the display apparatus and improves user experience.

In a possible embodiment, that the IC is separately connected to the outgoing line extension end of the AMOLED panel and the PCB includes: The outgoing line extension end of the AMOLED panel and the PCB are respectively connected to a first surface and a second surface of the IC. The touch panel is integrated on the upper surface of the AMOLED panel, and only the outgoing line of the AMOLED panel is folded, instead of folding the outgoing line of the touch panel. This further reduces the width of the frame of the display apparatus and improves user experience.

In a possible embodiment, at least one via is disposed on the upper surface that is of the AMOLED panel and on which the touch panel is integrated, and that the IC is separately connected to the outgoing line end of the AMOLED panel and the PCB includes: The IC is connected to a lower surface that is of the AMOLED panel and that is provided with the at least one via, and the IC is connected to the PCB. The touch panel is integrated and interconnected to the upper surface of the AMOLED panel by using the via, and it is unnecessary to bend the outgoing line of the touch panel and the outgoing line of the AMOLED panel to a rear side of the display apparatus. This further reduces the width of the frame of the display apparatus and improves user experience.

In a possible embodiment, the display apparatus further includes an FPC. That the IC is separately connected to the outgoing line end of the AMOLED panel and the PCB includes: The IC is connected to the lower surface that is of the AMOLED panel and that is provided with the at least one via, and the IC is connected to the PCB by using the FPC.

In a possible embodiment, the IC is disposed in the PCB. That the IC is separately connected to the outgoing line end of the AMOLED panel and the PCB includes: The PCB is connected to the outgoing line end of the AMOLED panel at a position at which the IC is disposed.

In a possible embodiment, the display apparatus further includes a copper foil. The copper foil is disposed on a lower surface of the AMOLED panel, and the copper foil is connected to the PCB.

According to a third aspect, an embodiment provides an electronic device. The electronic device may include: a display apparatus and a processor. The display apparatus includes an AMOLED panel, a touch panel, an IC, and a PCB. The touch panel is disposed on an upper surface of the AMOLED panel, and the touch panel and the AMOLED panel each have an outgoing line. The outgoing line of the touch panel and the outgoing line of the AMOLED panel are separately extended to form an outgoing line extension end of the touch panel and an outgoing line extension end of the AMOLED panel. The outgoing line end of the AMOLED panel and the outgoing line end of the touch panel are electrically connected to the PCB by using the IC. The IC is configured to drive the display apparatus to display a picture.

In the electronic device, a flexible bending panel is used, and the flexible bending panel has a smaller bending radius. This reduces a width of a frame of the electronic device and increases a screen-to-body ratio.

In a possible embodiment, that the outgoing line extension end of the AMOLED panel and the outgoing line extension end of the touch panel are electrically connected to the PCB by using the IC includes: The outgoing line extension end of the AMOLED panel and the outgoing line extension end of the touch panel are respectively connected to a first surface and a second surface of the IC, and the outgoing line extension end of the AMOLED panel or the outgoing line extension end of the touch panel is connected to the PCB. The touch control panel and the AMOLED panel are integrated by using the IC, and are centrally routed out to connect to the PCB, so that the IC has a logical integration function of display and touch, and improves user experience.

In a possible embodiment, the IC includes a first IC and a second IC. That the outgoing line extension end of the AMOLED panel and the outgoing line extension end of the touch panel are electrically connected to the PCB by using the IC includes: The outgoing line extension end of the AMOLED panel is connected to the first IC and the PCB, and after the outgoing line extension end of the touch panel is connected to the second IC and the outgoing line extension end of the AMOLED panel, the outgoing line extension end of the touch panel is electrically connected to the PCB by using the outgoing line extension end of the AMOLED panel; or the outgoing line extension end of the touch panel is connected to the second IC and the PCB, and after the outgoing line extension end of the AMOLED panel is connected to the first IC and the outgoing line extension end of the touch panel, the outgoing line extension end of the AMOLED panel is electrically connected to the PCB by using the outgoing line extension end of the touch panel.

According to a fourth aspect, an embodiment provides an electronic device. The electronic device includes a display apparatus and a processor. The display apparatus includes an AMOLED panel, a touch panel, an IC, and a PCB. The touch panel is integrated on an upper surface of the AMOLED panel, and the IC is separately connected to an outgoing line extension end of the AMOLED panel and the PCB. The IC is configured to drive the display apparatus to display a picture.

According to the electronic device in this embodiment, the touch panel is integrated on the upper surface of the AMOLED panel, and the outgoing line of the touch panel does not need to be folded. This reduces a width of a frame of the display apparatus and improves user experience.

In a possible embodiment, that the IC is separately connected to the outgoing line extension end of the AMOLED panel and the PCB includes: The outgoing line extension end of the AMOLED panel and the PCB are respectively connected to a first surface and a second surface of the IC. The touch panel is integrated on the upper surface of the AMOLED panel, and only the outgoing line of the AMOLED panel is folded, instead of folding the outgoing line of the touch panel. This further reduces the width of the frame of the display apparatus and improves user experience.

In a possible embodiment, at least one via is disposed on the upper surface that is of the AMOLED panel and on which the touch panel is integrated, and that the IC is separately connected to the outgoing line extension end of the AMOLED panel and the PCB includes: The IC is connected to a lower surface that is of the AMOLED panel and that is provided with the at least one via, and the IC is connected to the PCB. The touch panel is integrated and interconnected to the upper surface of the AMOLED panel by using the via, and it is unnecessary to bend the outgoing line of the touch panel and the outgoing line of the AMOLED panel to a rear side of the display apparatus. This further reduces the width of the frame of the display apparatus and improves user experience.

In a possible embodiment, the display apparatus further includes an FPC. That the IC is separately connected to the outgoing line extension end of the AMOLED panel and the PCB includes: The IC is connected to the lower surface that is of the AMOLED panel and that is provided with the at least one via, and the IC is connected to the PCB by using the FPC.

In a possible embodiment, the IC is disposed in the PCB. That the IC is separately connected to the outgoing line extension end of the AMOLED panel and the PCB includes:

The PCB is connected to the outgoing line extension end of the AMOLED panel at a position at which the IC is disposed.

In a possible embodiment, the display apparatus further includes a copper foil. The copper foil is disposed on a lower surface of the AMOLED panel, and the copper foil is connected to the PCB.

According to a fifth aspect, an embodiment provides a method for manufacturing a display apparatus, and the method for manufacturing a display apparatus may include: manufacturing an AMOLED panel and a touch panel, and separately extending an outgoing line of the AMOLED panel and an outgoing line of the touch panel; fully fitting an AMOLED area of the AMOLED panel to a touch area of the touch panel, fitting a polarizer to the touch area, or fitting the polarizer to an upper surface of the AMOLED panel, or fitting the polarizer to an upper surface or a lower surface of the touch panel, and fully fitting the AMOLED and the touch; fully fitting cover glass to the upper surface of the touch panel; fitting a protective layer to a rear side of the AMOLED panel; performing a thermo compression process on fanout routing on the AMOLED panel and fanout routing on the touch panel, bonding an upper surface of an IC to the AMOLED panel, and bonding a lower surface of the IC to the touch panel; bending the outgoing line of the AMOLED panel and the outgoing line of the touch panel that are separately bonded with the IC to a rear side of a screen, and attaching the outgoing line of the AMOLED panel and the outgoing line of the touch panel to the rear side of the screen by using an adhesive, where a bending axis is parallel to a long side of a bending area, to form an integrated display and touch control screen; and connecting an outgoing line end of the integrated display and touch control screen to a functional board such as a PCB, to form the display apparatus.

In a possible embodiment, an extended length needs to ensure that the extended outgoing line can be bent to the rear side of the panel. A distance from a lower edge of the touch area to a reserved area on which the IC is bonded is greater than a fanout length of the AMOLED panel because a bending radius of the touch is greater than that of the AMOLED. A fanout area can have different external outlines and routing, but functions are the same. In a fanout centralized outgoing line area, complex routing is centrally input to the IC, and a smaller quantity of drive lines are output after integration.

In a possible embodiment, the protective layer includes foam, a copper foil, and the like. The copper foil has functions such as heat dissipation, grounding, and electromagnetic shielding.

In a possible embodiment, the thermo compression process may be performed on the fanout and lead wire area parts of the AMOLED panel in advance. For example, the thermo compression process is performed on fanout routing on a sector area of the AMOLED panel, and a reinforcement process such as a reinforcement plate is performed before the upper surface of the IC is bonded to the AMOLED panel. To reduce undesirable loss, chip on plastic (COP) may alternatively be arranged at a stage after AMOLED Array is completed. In other words, the COP may be completed before the AMOLED panel is transferred from glass to polyethylene terephthalate base material.

In a possible embodiment, the thermo compression process may be performed on the fanout of the touch panel in advance. For example, the thermo compression process is performed on fanout routing on the touch panel, and the reinforcement process such as the reinforcement plate is performed before the lower surface of the IC is bonded to the touch panel.

Compared with the related art, in the display apparatus, the method for manufacturing the display apparatus, and the electronic device provided in this embodiment, the outgoing line of the touch panel and the outgoing line of the AMOLED panel are extended, and are electrically connected to the PCB by using the IC, to replace an FPC to route drive lines of the touch panel and the AMOLED panel. This resolves a problem in the related art that a relatively large quantity of components need to be used to manufacture a display apparatus, resulting in a low yield rate and high costs.

DESCRIPTION OF EMBODIMENTS

Embodiments provide a display apparatus, a method for manufacturing the display apparatus, and an electronic device, which are applicable to a display apparatus using an AMOLED, such as a mobile phone, a tablet computer, and an in-vehicle device.

The display apparatus provided in this embodiment is applicable to two forms: a form in which an AMOLED panel is fitted to a touch panel, and a form in which the touch panel is integrated or the panel is connected to the AMOLED panel by using a via and a slope.

Figure 1:
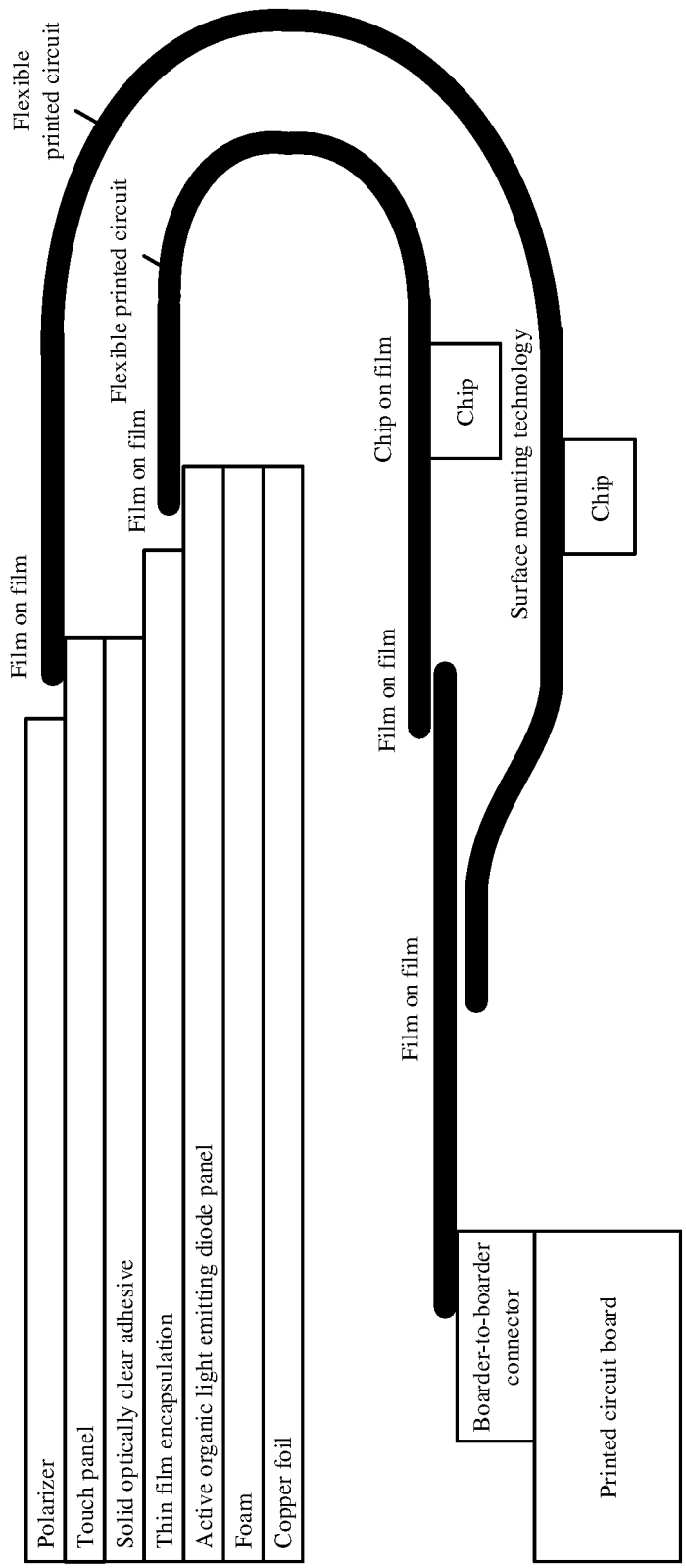
FIG. 1 is a schematic diagram of a display apparatus in the related art.
Figure 2:
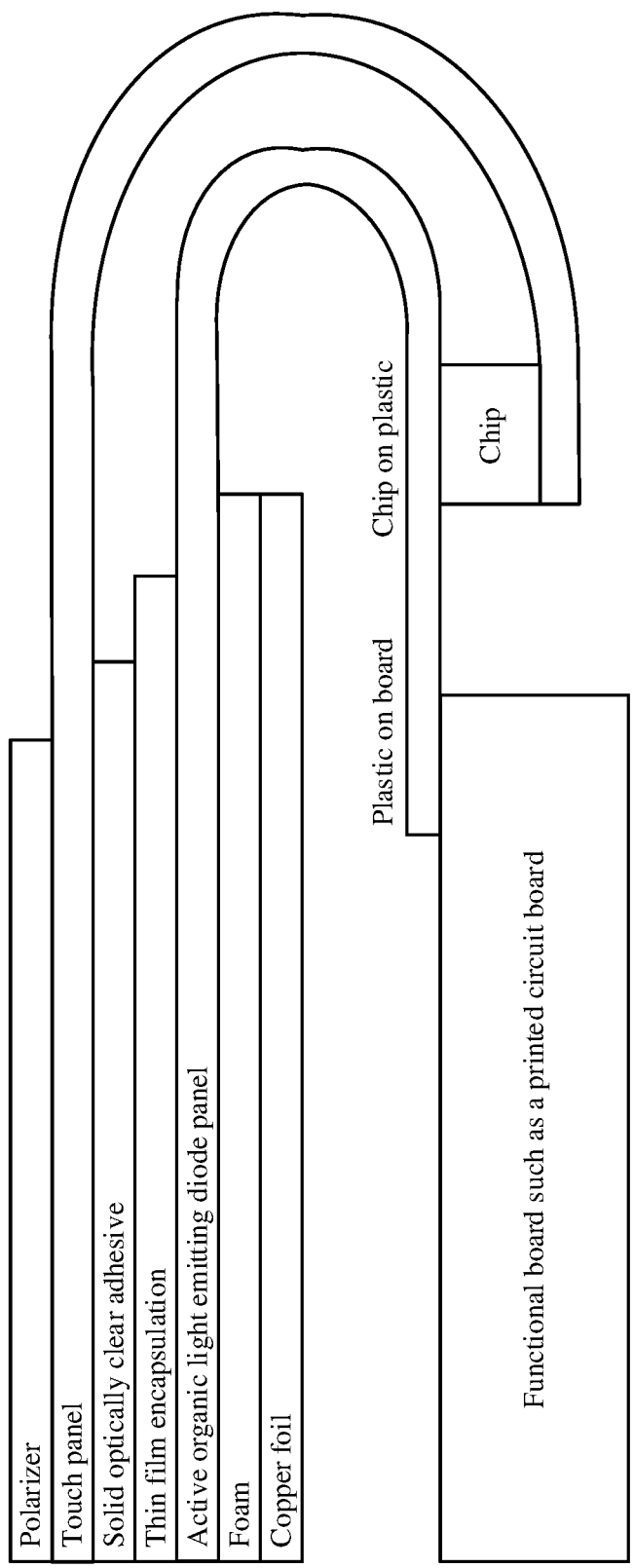
FIG. 2 is a schematic diagram 1 of a display apparatus according to an embodiment.

In the first form, the display apparatus may include a polarizer, a touch panel, a solid optically clear adhesive (OCA), TFE, an AMOLED panel, foam, and a copper foil. All the foregoing materials may be connected by using a fitting process. The polarizer may be fitted to an upper surface of the AMOLED panel, or fitted to an upper surface or a lower surface of the touch panel. In FIG. 2, an example in which the foregoing materials are sequentially fitted from top to bottom is used.

Figure 8:
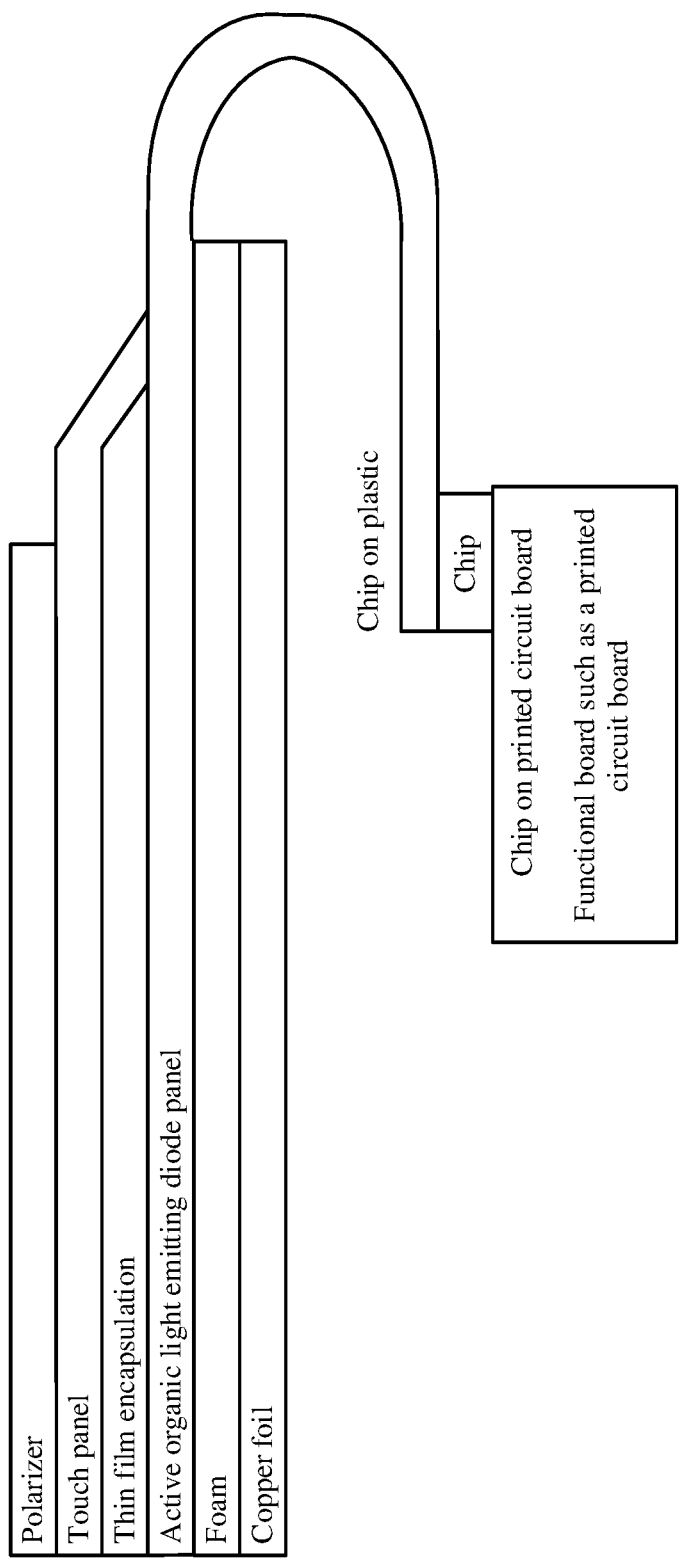
FIG. 8 is a schematic diagram 5 of a display apparatus according to an embodiment.

In the second form, the display apparatus includes a polarizer, a touch panel, TFE, an AMOLED panel, foam, and a copper foil. As shown in FIG. 8: The touch panel is integrated on the upper surface of the AMOLED panel.

In this embodiment, the AMOLED panel may be fitted to the touch panel by using the solid OCA. An outgoing line of the AMOLED panel and an outgoing line of the touch panel are extended and bent, and the AMOLED panel that carries an outgoing line routed by an IC or the touch panel that carries an outgoing line routed by an IC is connected to a PCB of the display apparatus in a plastic on board (POB) or another manner. This reduces a quantity of components, costs, and a width of a frame of the electronic device.

The following describes the solutions in the embodiments with reference to the accompanying drawings.

FIG. 2 is a schematic diagram of a display apparatus according to an embodiment. As shown in FIG. 2, the display apparatus may be disposed in an electronic device.

In FIG. 2, the display apparatus may include functional boards such as an AMOLED panel, a touch panel, an IC, and a PCB.

It should be noted that the functional board such as the PCB refers to a functional component that can input and process data. For example, a chip, a plastic carrier carrying a chip, or a flexible printed circuit board. For ease of description, the following uses a PCB as an example for description. For ease of description, the AMOLED panel and the touch panel are collectively referred to as an AMOLED panel and a touch panel in the following.

The touch panel is disposed on an upper surface of the AMOLED panel, the AMOLED panel has an outgoing line, and the touch panel has an outgoing line. The outgoing line of the AMOLED panel and the outgoing line of the touch panel are respectively extended to form an outgoing line extension end of the AMOLED panel and an outgoing line extension end of the touch panel. The outgoing line extension end of the AMOLED panel and the outgoing line extension end of the touch panel are electrically connected to the PCB by using an IC. The IC is configured to drive the display apparatus to display a picture.

In this embodiment, by using flexible features of the AMOLED panel and the touch panel, outgoing lines of the AMOLED panel and the touch panel are extended to form outgoing line extension ends, and the outgoing line extension ends of the AMOLED panel and the touch panel are connected by using an IC. In this way, it can replace a manner in the related art in which two FPCs respectively route the drive lines of the touch panel and the AMOLED panel. Accordingly, two independent FPCs, one COF connector, and one BTB are reduced, which greatly reduces costs. In addition, because a flexible bending panel has a smaller bending radius, a width of a frame of the electronic device is further reduced and user experience is improved.

In a possible embodiment, that the outgoing line extension end of the AMOLED panel and the outgoing line extension end of the touch panel are electrically connected to the PCB by using the IC includes: The outgoing line extension end of the AMOLED panel and the outgoing line extension end of the touch panel are respectively bent to a rear side of the AMOLED panel; on the rear side of the AMOLED panel, the outgoing line extension end of the AMOLED panel and the outgoing line extension end of the touch panel are respectively connected to a first surface and a second surface of the IC; and the outgoing line extension end of the AMOLED panel or the outgoing line extension end of the touch panel is connected to the PCB.

Figure 5:
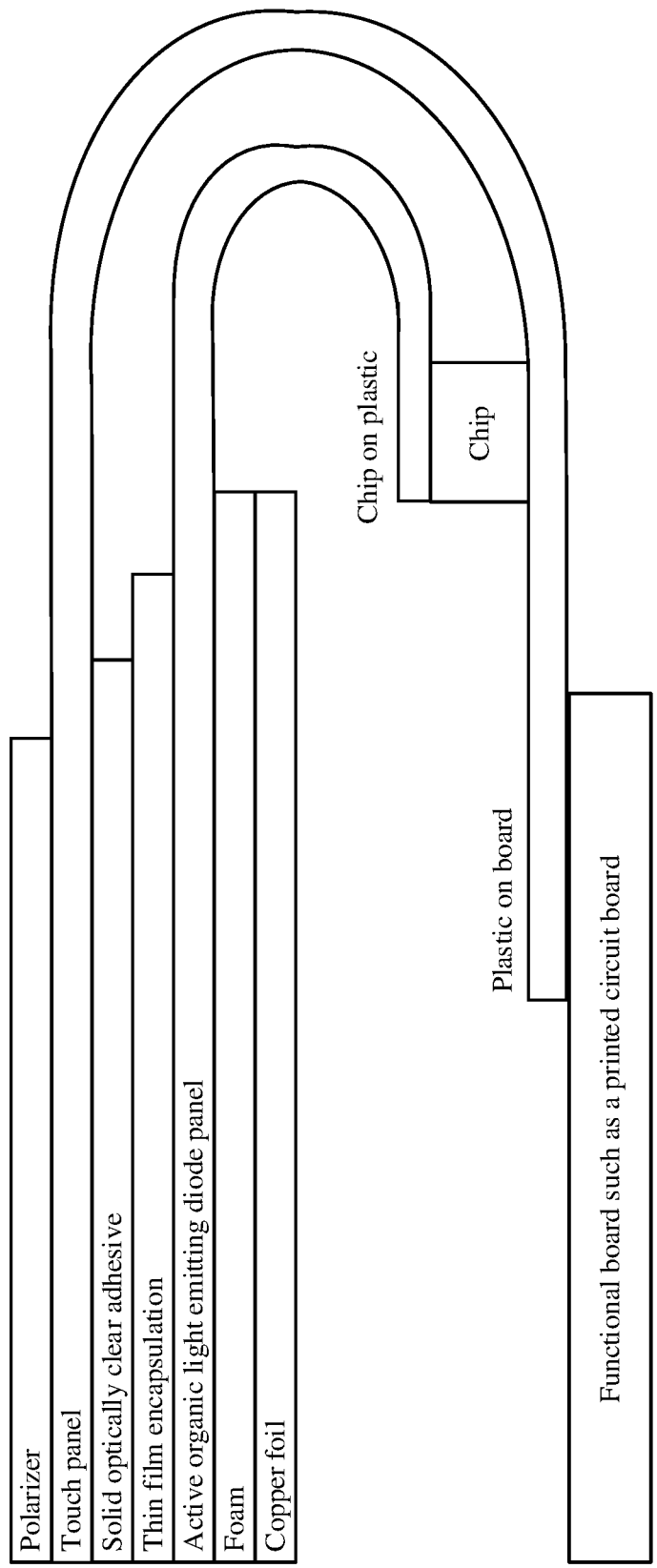
FIG. 5 is a schematic diagram 2 of a display apparatus according to an embodiment.

Specifically, the outgoing line of the touch panel and the outgoing line of the AMOLED panel are respectively connected to an upper surface and a lower surface of the IC. For example, the outgoing line of the touch panel and the outgoing line of the AMOLED panel are connected to the upper surface and the lower surface of the IC by using a COP process, and the IC has a logical integration function of display and touch. The outgoing line extension end of the AMOLED panel is connected to the PCB (as shown in FIG. 2), or the outgoing line extension end of the touch panel is connected to the PCB (as shown in FIG. 5). The touch panel and the AMOLED panel are integrated by using the IC, and are centrally routed out to connect to the PCB, so that the IC has a logical integration function of display and touch, and improves user experience.

Figure 3:
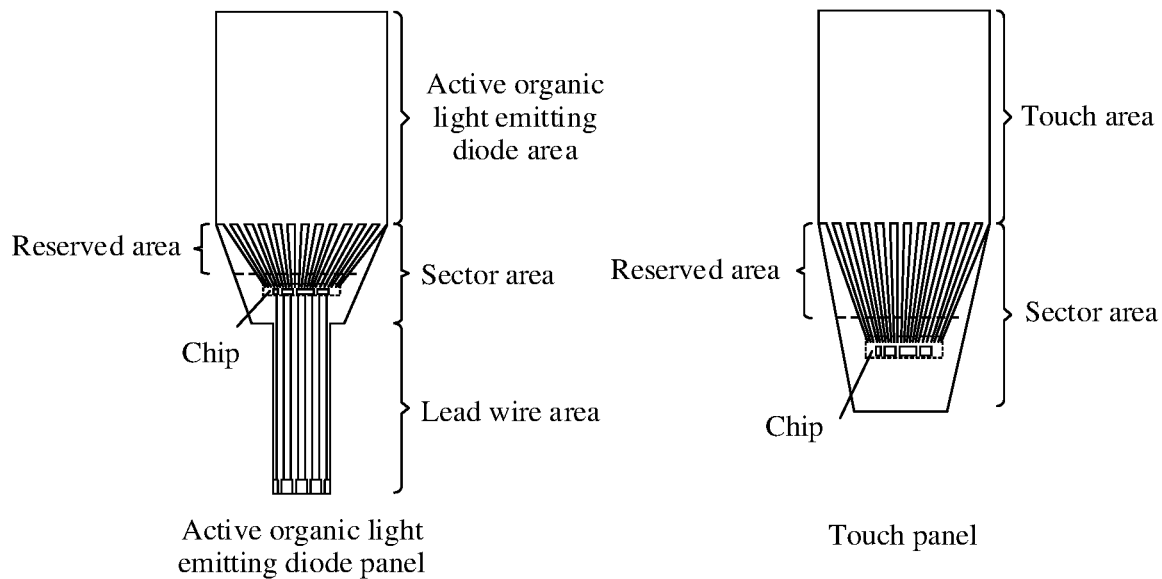
FIG. 3 is a schematic structural diagram of an AMOLED panel and a touch panel in a display apparatus according to an embodiment, and a schematic diagram of a drive line of the AMOLED panel and the touch panel.

With reference to FIG. 3, steps that may be included in manufacturing the display apparatus shown in FIG. 2 are described.

In step 1, manufacture a flexible AMOLED panel and a flexible touch panel and extend an outgoing line of the flexible AMOLED panel and an outgoing line of the touch panel. An extended length needs to ensure that the extended outgoing line can be bent to the rear side of the panel. A distance from a lower edge of a touch area to a reserved area on which the IC is bonded is greater than a fanout length of the AMOLED panel because a bending radius of the touch is greater than that of the AMOLED. A fanout area can have different external outlines and routing, but functions are the same. In a fanout centralized outgoing line area, complex routing is centrally input to the IC, and a smaller quantity of drive lines are output after integration.

In step 2, fully fit an AMOLED area to the touch area by using an OCA adhesive, and fit a polarizer to the touch area. Alternatively, the polarizer may be fitted to the upper surface of the AMOLED panel, or the polarizer is fitted to the upper or lower surface of the touch panel, and then the AMOLED area is fully fitted to the touch area.

In step 3, fully fit the touch panel to cover glass. The OCA is commonly used in a fully fitting process.

In step 4, fit foam, a copper foil, and other protective layers to the rear side of the AMOLED. The copper foil has functions such as heat dissipation, grounding, and electromagnetic shielding.

In step 5, perform a COP thermo compression process on fanout routing on the AMOLED panel, and bond an upper surface of the IC to the AMOLED panel.

A reinforcement process such as a reinforcement plate may be performed on the fanout of the AMOLED panel and the lead wire area parts in advance, for example, may be performed before step 5. To reduce undesirable loss, COP may alternatively be arranged at a stage after AMOLED Array is completed. In other words, the COP may be completed before the AMOLED panel is transferred from glass to polyethylene terephthalate base material.

In step 6, perform the COP thermo compression process on the fanout routing of the touch panel and bond the lower surface of the IC to the touch panel.

The reinforcement process such as the reinforcement plate may be performed on the fanout of the touch panel in advance, for example, may be performed before step 6.

In step 7, bend an outgoing line of the AMOLED panel that carries the IC and an outgoing line of the touch panel that carries the IC. In other words, most of the fanout and lead wire areas of the AMOLED panel and touch panel to a rear side of a screen and attached to the rear side of the screen by using an adhesive, the bending axis is parallel to the long edge (dotted line) of the bending area shown in the figure, to form an integrated display and touch control screen.

In step 8, connect an outgoing line end of the integrated display and touch control screen to a functional board such as a mainboard through BTB, zero insertion force (ZIF), or POB, to form the display apparatus. As shown in FIG. 2 (the cover glass is not shown):

It should be noted that the display apparatus manufactured in the foregoing steps has both a display function and a touch control function, and the display apparatus may be referred to as a display apparatus integrated with display and touch control.

Figure 4:
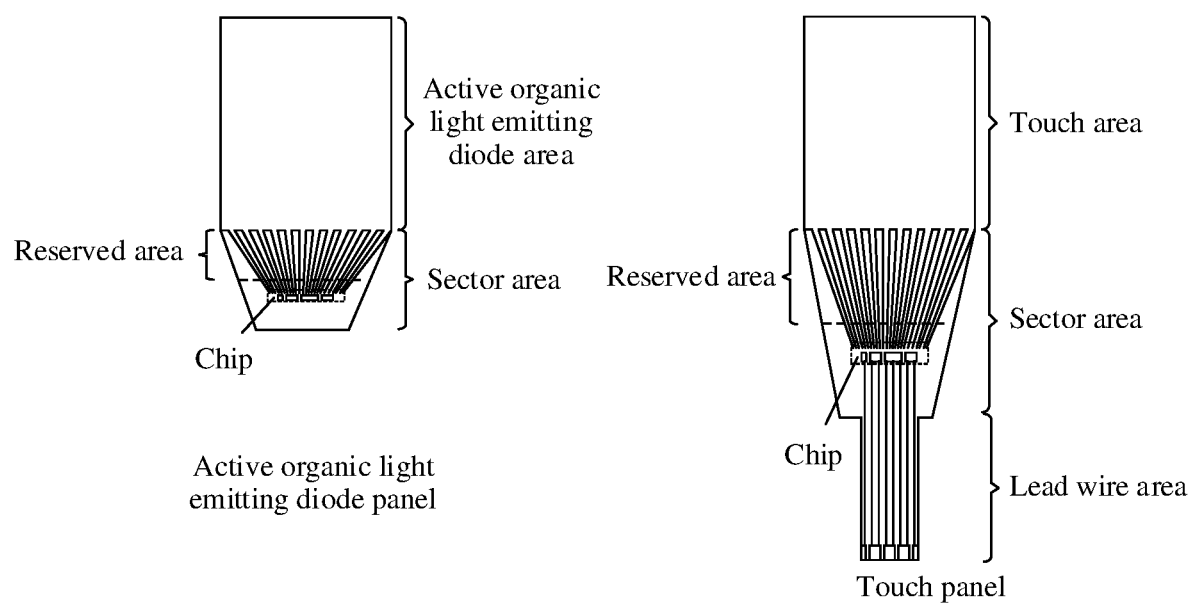
FIG. 4 is another schematic structural diagram of an AMOLED panel and a touch panel in a display apparatus according to an embodiment, and another schematic diagram of a drive line of the AMOLED panel and the touch panel according to an embodiment.

The display apparatus shown in FIG. 5 is different from the display apparatus shown in FIG. 2. In FIG. 2, the outgoing line extension end of the AMOLED panel is connected to the PCB, while in FIG. 5, the outgoing line extension end of the touch panel is connected to the PCB. For a step of manufacturing the display apparatus shown in FIG. 5, refer to the step of manufacturing the display apparatus shown in FIG. 2. The touch panel and the AMOLED panel in FIG. 5 are manufactured based on structures of the touch panel and the AMOLED panel in FIG. 4.

In this embodiment, the display apparatus is manufactured by using the foregoing steps. The AMOLED panel and the touch panel are bent to the rear side of the display screen for electrical connection, and COP thermo compression is performed by fully using the upper surface and the lower surface of the IC, to form that both sides of the IC have a flexible panel for electrical connection with the IC, so that the IC has a logical integration function. Compared with the related art, two independent FPCs, one COF connector, and one BTB are reduced, and the number of electrical connection processes is reduced from seven to two. This greatly reduces the number of components and costs. Because the flexible bending panel is relatively thin, and a bending radius is smaller, a frame of the electronic device can be greatly reduced.

In a possible embodiment, the IC includes a first IC and a second IC. That the outgoing line extension end of the AMOLED panel and the outgoing line extension end of the touch panel are electrically connected to the PCB by using the IC includes: The outgoing line extension end of the AMOLED panel is connected to the first IC and the PCB, and after the outgoing line extension end of the touch panel is connected to the second IC and the outgoing line extension end of the AMOLED panel, the outgoing line extension end of the touch panel is electrically connected to the PCB by using the outgoing line extension end of the AMOLED panel. Alternatively, the outgoing line extension end of the touch panel is connected to the second IC and the PCB, and after the outgoing line extension end of the AMOLED panel is connected to the first IC and the outgoing line extension end of the touch panel, the outgoing line extension end of the AMOLED panel is electrically connected to the PCB by using the outgoing line extension end of the touch panel.

In this embodiment, a display IC and a touch IC are respectively bonded to the outgoing line of the AMOLED panel and the outgoing line of the touch panel, and are electrically connected by using plastic on plastic and a plastic on plastic process, to implement an electric connection by performing thermal compression on the AMOLED panel and the touch panel. The screen is finally routed from the AMOLED panel (FIG. 6) or the touch panel (FIG. 7) to the PCB, to form a display apparatus.

Figure 6:
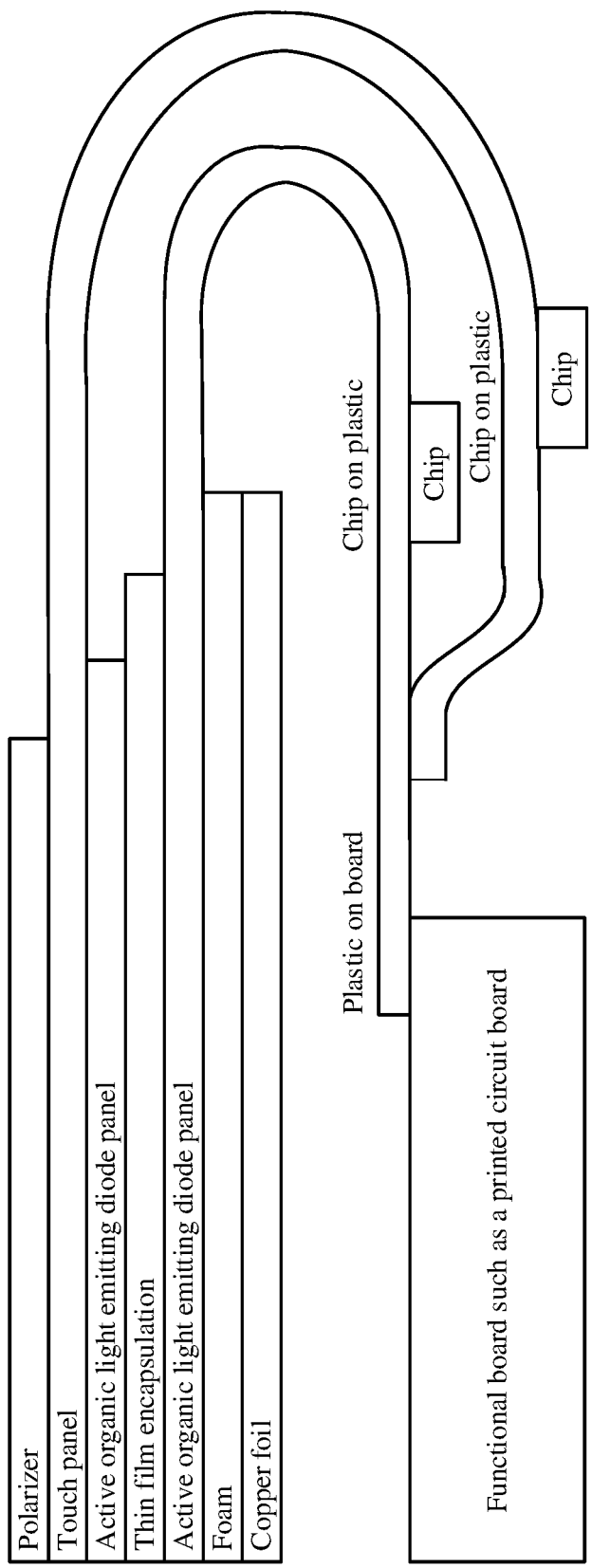
FIG. 6 is a schematic diagram 3 of a display apparatus according to an embodiment.
Figure 7:
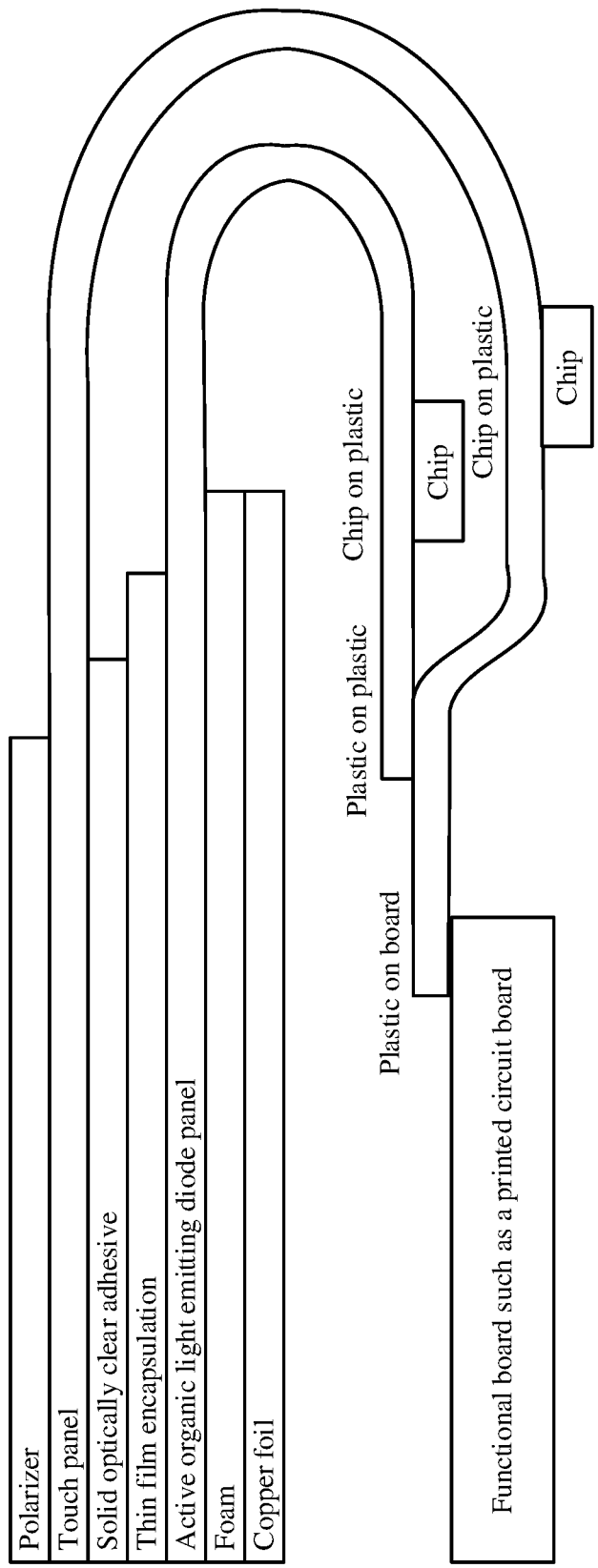
FIG. 7 is a schematic diagram 4 of a display apparatus according to an embodiment.

For steps of manufacturing the display apparatus in FIG. 6 or FIG. 7, refer to the steps of the display apparatus in FIG. 2 and FIG. 5 respectively. FIG. 6 is different from FIG. 2. In FIG. 6, the touch panel and the AMOLED panel separately have a corresponding IC, while in FIG. 2, the touch panel and the AMOLED panel share one IC.

In this embodiment, an electrical connection refers to a non-physical connection. For example, the AMOLED panel or the touch panel is connected to the PCB by using another component, instead of being directly connected to the PCB. The outgoing line refers to a line arranged on a surface of a panel, and the outgoing line extension end refers to a part extending from the surface of the panel.

In an exemplary embodiment, a flexible panel body is used to replace an FPC as a main body from which touch and display drive lines route to a mainboard by using a bendable feature of a screen. An IC is bonded on the panel or the PCB in a flexible manner. This implements an electrical connection solution of an efficient and low-cost touch and display.

FIG. 8 is a schematic diagram of a display apparatus according to an embodiment. As shown in FIG. 8, the display apparatus may be disposed in an electronic device.

In FIG. 8, the display apparatus may include an AMOLED panel, a touch panel, an IC, and a PCB. The touch panel is integrated on an upper surface of the AMOLED panel, and the IC is separately connected to an outgoing line extension end of the AMOLED panel and the PCB. The IC is configured to drive the display apparatus to display a picture.

According to the display apparatus in this embodiment, the touch panel is integrated on the upper surface of the AMOLED panel, and an outgoing line of the touch panel does not need to be bent. This further reduces a width of a frame of the display apparatus and improves user experience.

In a possible embodiment, that the IC is separately connected to the outgoing line extension end of the AMOLED panel and the PCB includes: The outgoing line extension end of the AMOLED panel and the PCB are respectively connected to a first surface and a second surface of the IC.

If the display apparatus does not have an independent touch film, but integrates and connects a touch function with the AMOLED panel, or does not have the touch function, only the AMOLED panel or an AMOLED-touch panel that carries a touch line needs to be routed out, and the outgoing line extension end of the AMOLED panel is connected to a PCB functional board through chip on board (COB) and COP (which may be separately completed or completed at a time), as shown in FIG. 8.

In a possible embodiment, the IC is disposed in the PCB. That the IC is separately connected to the outgoing line extension end of the AMOLED panel and the PCB includes: The PCB is connected to the outgoing line extension end of the AMOLED panel at a position at which the IC is disposed.

Figure 9:
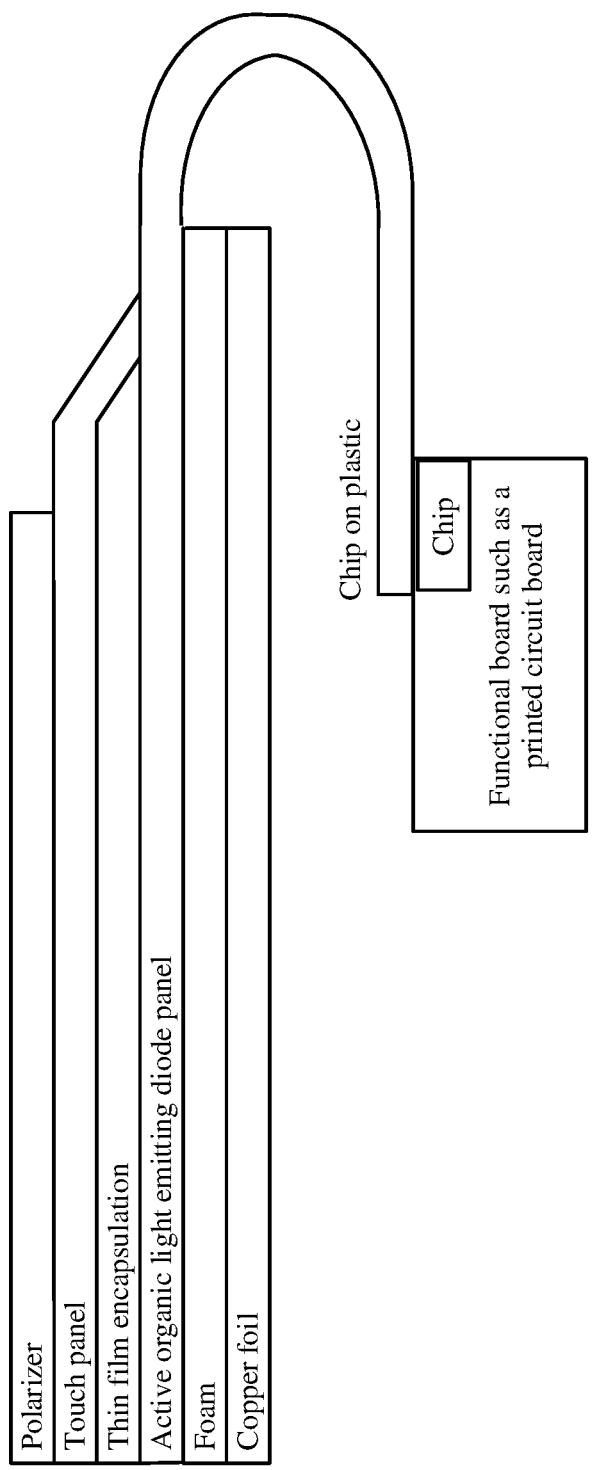
FIG. 9 is a schematic diagram 6 of a display apparatus according to an embodiment.

On the basis of FIG. 8, the IC is buried in the PCB, and the IC implements interconnection by using a PCB manufacturing process. The AMOLED panel or the AMOLED-touch panel that carries the touch line is interconnected with the PCB through the COP, as shown in FIG. 9.

In this embodiment, the outgoing line of the AMOLED panel is extended and bent, and is connected to an upper surface of the IC. A lower surface of the IC is completely or partially buried in the PCB by using a POB process or the IC. In this way, an electrical connection structure may be simply implemented.

In a possible embodiment, at least one via is disposed on the upper surface that is of the AMOLED panel and on which the touch panel is integrated, and that the IC is separately connected to the outgoing line extension end of the AMOLED panel and the PCB includes: The IC is connected to a lower surface that is of the AMOLED panel and that is provided with the at least one via, and the IC is connected to the PCB.

Figure 10:
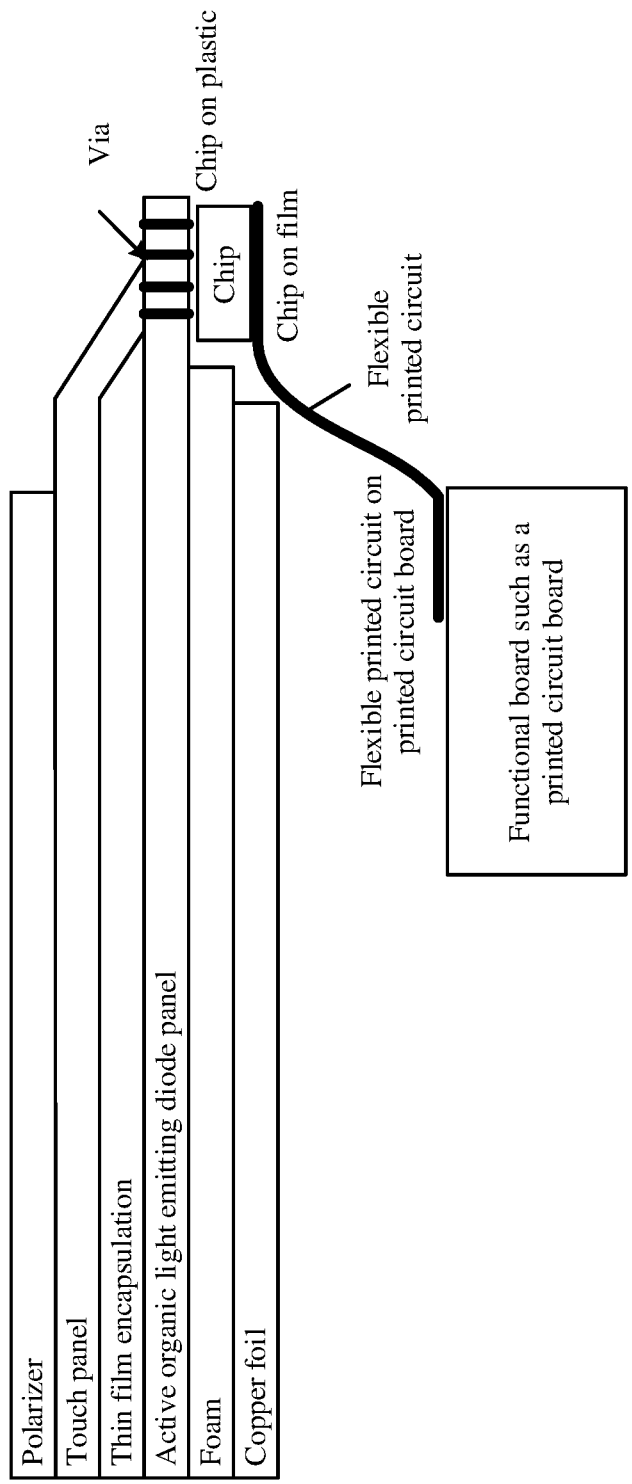
FIG. 10 is a schematic diagram 7 of a display apparatus according to an embodiment.

If the display apparatus does not have an independent touch film, but interconnects the touch with the AMOLED panel by using a via, or does not have a touch function, drive lines of the touch and the display are routed to the rear side of the display by using the via, and the IC-driven lines are output to the FPC through FOB and COP (which may be separately completed or completed at a time), and then is interconnected with the PCB in a form such as the FOB, as shown in FIG. 10.

In a possible embodiment, the display apparatus further includes an FPC. That the IC is separately connected to the outgoing line extension end of the AMOLED panel and the PCB includes: The IC is connected to the lower surface that is of the AMOLED panel and that is provided with the at least one via, and the IC is connected to the PCB by using the FPC.

In a possible embodiment, the display apparatus further includes a copper foil. The copper foil is disposed on a lower surface of the AMOLED panel, and the copper foil is connected to the PCB.

Figure 11:
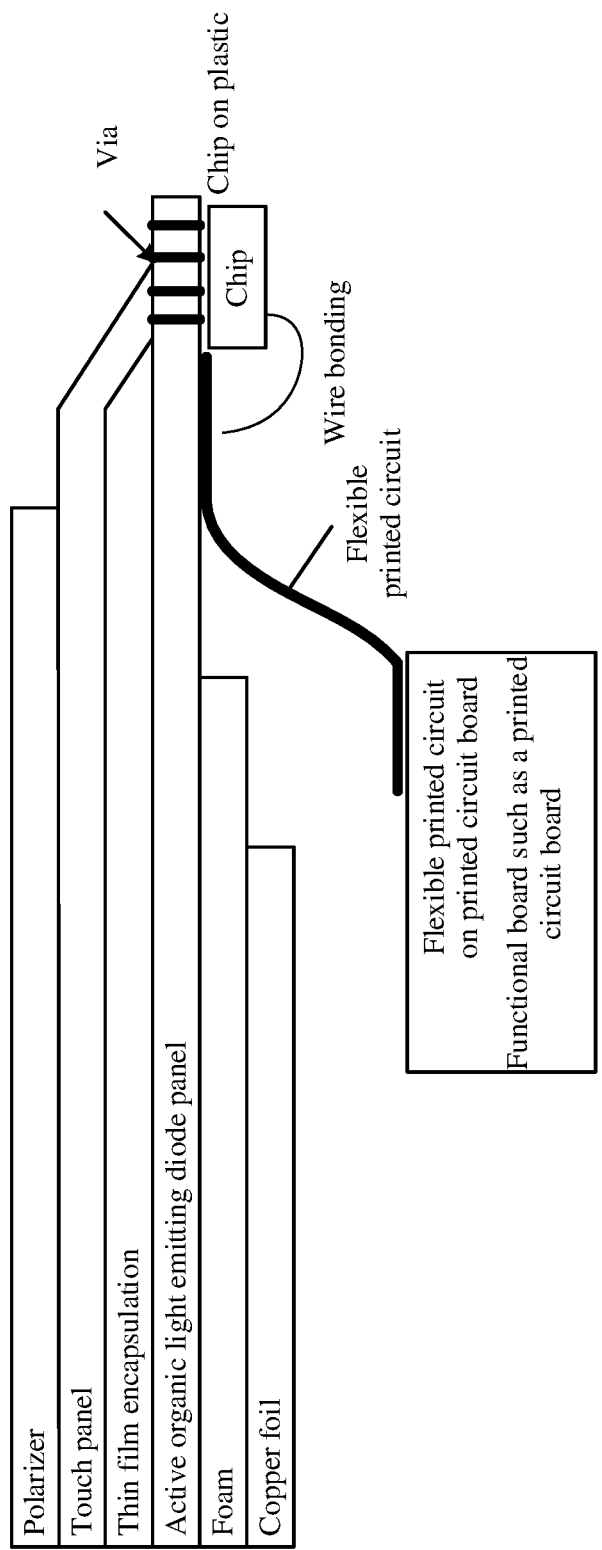
FIG. 11 is a schematic diagram 8 of a display apparatus according to an embodiment.
Figure 12:
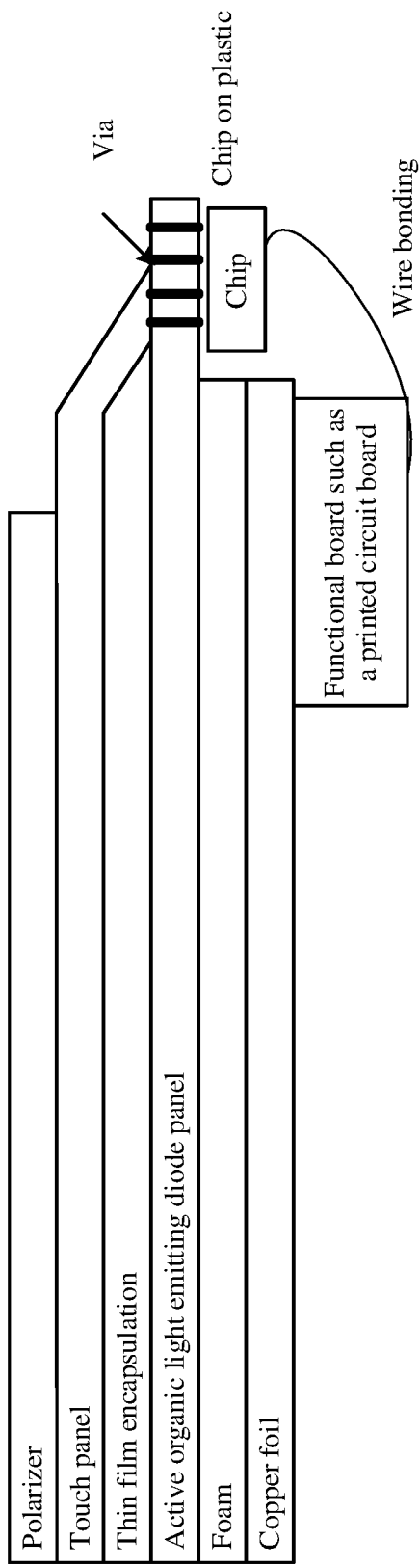
FIG. 12 is a schematic diagram 9 of a display apparatus according to an embodiment.

On the basis of FIG. 10, an output line of the IC may be interconnected with the FPC by using a semiconductor bonding alloy wire/wire bonding, and then the FPC is interconnected with the PCB through FOB, as shown in FIG. 11. Alternatively, the output line of the IC is directly connected to the PCB board by using the wire bonding, and an upper surface of the PCB may be connected to a lower surface of the copper foil by using the wire bonding.

In this embodiment, the at least one via is disposed on the AMOLED panel, so that the drive line is conducted to the rear side of the panel. This eliminates bending of the flexible AMOLED panel and the touch panel, and greatly reduces a width of a frame of the electronic device.

An embodiment further provides an electronic device. The electronic device may include the display apparatus and the processor shown in any one of the foregoing embodiments.

The display apparatus includes an AMOLED panel, a touch panel, an IC, and a PCB. The touch panel and the AMOLED panel each have an outgoing line. The outgoing line of the touch panel and the outgoing line of the AMOLED panel are extended to form an outgoing line extension end of the touch panel and an outgoing line extension end of the AMOLED panel. The outgoing line extension end of the AMOLED panel and the outgoing line extension end of the touch panel are electrically connected to the PCB by using the IC. The IC is configured to drive the display apparatus to display a picture.

In the electronic device, a flexible bending panel is used, and the flexible bending panel has a smaller bending radius. This reduces a width of a frame of the electronic device and increases a screen-to-body ratio.

In a possible embodiment, that the outgoing line extension end of the AMOLED panel and the outgoing line extension end of the touch panel are electrically connected to the PCB by using the IC includes: The outgoing line extension end of the AMOLED panel and the outgoing line extension end of the touch panel are respectively connected to a first surface and a second surface of the IC, and the outgoing line extension end of the AMOLED panel or the outgoing line extension end of the touch panel is connected to the PCB. The touch panel and the AMOLED panel are integrated by using the IC, and are centrally routed out to connect to the PCB, so that the IC has a logical integration function of display and touch, and improves user experience.

In a possible embodiment, the IC includes a first IC and a second IC. That the outgoing line extension end of the AMOLED panel and the outgoing line extension end of the touch panel are electrically connected to the PCB by using the IC includes: The outgoing line extension end of the AMOLED panel is connected to the first IC and the PCB, and after the outgoing line extension end of the touch panel is connected to the second IC and the outgoing line extension end of the AMOLED panel, the outgoing line extension end of the touch panel is electrically connected to the PCB by using the outgoing line extension end of the AMOLED panel. Alternatively, the outgoing line extension end of the touch panel is connected to the second IC and the PCB, and after the outgoing line extension end of the AMOLED panel is connected to the first IC and the outgoing line extension end of the touch panel, the outgoing line extension end of the AMOLED panel is electrically connected to the PCB by using the outgoing line extension end of the touch panel.

For details of the display apparatus provided in this embodiment, refer to descriptions in FIG. 2 to FIG. 11. For brevity, details are not described herein again.

In this embodiment, the electronic device is a mobile phone or a wearable device.

An embodiment further provides an electronic device. The electronic device may include the display apparatus and the processor shown in any one of the foregoing embodiments.

The display apparatus may include an AMOLED panel, a touch panel, an IC, and a PCB. The touch panel is integrated on an upper surface of the AMOLED panel, and the IC is separately connected to an outgoing line extension end of the AMOLED panel and the PCB. The IC is configured to drive the display apparatus to display a picture.

According to the electronic device in this embodiment, the touch panel is integrated on the upper surface of the AMOLED panel, and an outgoing line of the touch panel does not need to be folded. This further reduces a width of a frame of the display apparatus and improves user experience.

In a possible embodiment, that the IC is separately connected to the outgoing line extension end of the AMOLED panel and the PCB includes: The outgoing line end of the AMOLED panel and the PCB are respectively connected to a first surface and a second surface of the IC. The touch panel is integrated on the upper surface of the AMOLED panel, and only the outgoing line of the AMOLED panel is folded. Compared with folding the outgoing line of the touch panel, folding the outgoing line of the AMOLED panel further reduces the width of the frame of the display apparatus and improves user experience.

In a possible embodiment, at least one via is disposed on the upper surface that is of the AMOLED panel and on which the touch panel is integrated, and that the IC is separately connected to the outgoing line extension end of the AMOLED panel and the PCB includes: The IC is connected to a lower surface that is of the AMOLED panel and that is provided with the at least one via, and the IC is connected to the PCB. The touch panel is integrated and connected to the upper surface of the AMOLED panel through the via, so that the outgoing line of the touch panel and the outgoing line of the AMOLED panel do not need to be bent to the rear side of the display apparatus. This further reduces the width of the frame of the display apparatus and improves user experience.

In a possible embodiment, the display apparatus further includes an FPC. That the IC is separately connected to the outgoing line extension end of the AMOLED panel and the PCB includes: The IC is connected to the lower surface that is of the AMOLED panel and that is provided with the at least one via, and the IC is connected to the PCB by using the FPC.

In a possible embodiment, the IC is disposed in the PCB. That the IC is separately connected to the outgoing line extension end of the AMOLED panel and the PCB includes: The PCB is connected to the outgoing line extension end of the AMOLED panel at a position at which the IC is disposed.

In a possible embodiment, the display apparatus further includes a copper foil. The copper foil is disposed on a lower surface of the AMOLED panel, and the copper foil is connected to the PCB.

For details of the display apparatus provided in this embodiment, refer to descriptions in FIG. 2 to FIG. 11. For brevity, details are not described herein again.

In this embodiment, the electronic device is a mobile phone or a wearable device.

The foregoing descriptions are merely exemplary implementations of the embodiments, but are not intended to limit the protection scope. Any variation or replacement readily figured out by a person skilled in the art within the technical scope disclosed in the present application shall fall within the protection scope. Therefore, the protection scope shall be subject to the protection scope of the claims.

What is claimed is:

1. An electronic device, comprising:
a display apparatus and a processor, wherein the display apparatus comprises an active-matrix organic light emitting diode (AMOLED) panel, a touch panel, a chip IC, and a printed circuit board, wherein the touch panel is disposed on an upper surface of the AMOLED panel, the touch panel and the AMOLED panel each has an outgoing line, the outgoing line of the touch panel and the outgoing line of the AMOLED panel are separately extended to form an outgoing line extension end of the touch panel and an outgoing line extension end of the AMOLED panel, the outgoing line extension end of the AMOLED panel and the outgoing line extension end of the touch panel are electrically connected to the printed circuit board by using the chip IC, wherein the chip IC is configured to drive the display apparatus to display a picture,
wherein the outgoing line extension end of the AMOLED panel and the outgoing line extension end of the touch panel are electrically connected to the printed circuit board by using the chip IC,
wherein the outgoing line extension end of the AMOLED panel and the outgoing line extension end of the touch panel are respectively connected to a first surface and a second surface of the chip IC, and the outgoing line extension end of the AMOLED panel or the outgoing line extension end of the touch panel is connected to the printed circuit board.

2. The electronic device according to claim 1, wherein the chip IC comprises a first chip IC and a second chip IC;
wherein the outgoing line extension end of the AMOLED panel and the outgoing line extension end of the touch panel are electrically connected to the printed circuit board by using the chip IC,
wherein the outgoing line extension end of the AMOLED panel is connected to the first chip IC and the printed circuit board, and after the outgoing line extension end of the touch panel is connected to the second chip IC and the outgoing line extension end of the AMOLED panel, the outgoing line extension end of the touch panel is electrically connected to the printed circuit board by using the outgoing line extension end of the AMOLED panel; or
the outgoing line extension end of the touch panel is connected to the second chip IC and the PCB, and after the outgoing line extension end of the AMOLED panel is connected to the first chip IC and the outgoing line extension end of the touch panel, the outgoing line extension end of the AMOLED panel is electrically connected to the printed circuit board by using the outgoing line extension end of the touch panel.

3. An electronic device, comprising a display apparatus and a processor, wherein the display apparatus comprises an active-matrix organic light emitting diode (AMOLED) panel, a touch panel, a chip IC, and a printed circuit board, wherein the touch panel is integrated on an upper surface of the AMOLED panel, and the chip IC is separately connected to an outgoing line extension end of the AMOLED panel and the printed circuit board, wherein the chip IC is configured to drive the display apparatus to display a picture,
wherein that the chip IC is separately connected to the outgoing line extension end of the AMOLED panel and the printed circuit board,
wherein the outgoing line extension end of the AMOLED panel and the printed circuit board are respectively connected to a first surface and a second surface of the chip IC.

4. The electronic device according to claim 3, wherein at least one via is disposed on an upper surface of the AMOLED panel and on which the touch panel is integrated,
wherein the chip IC is separately connected to the outgoing line extension end of the AMOLED panel and the printed circuit board,
wherein the chip IC is connected to a lower surface of the AMOLED panel that is provided with the at least one via, and the chip IC is connected to the printed circuit board.

5. The electronic device according to claim 4, wherein the display apparatus further comprises a flexible printed circuit board,
wherein the chip IC is separately connected to the outgoing line extension end of the AMOLED panel and the printed circuit board,
wherein the chip IC is connected to the lower surface of the AMOLED panel that is provided with the at least one via, and the chip IC is connected to the printed circuit board by using the flexible printed circuit board.

6. The electronic device according to claim 3, wherein the chip IC is disposed in the printed circuit board,
wherein the chip IC is separately connected to the outgoing line extension end of the AMOLED panel and the printed circuit board,
wherein the printed circuit board is connected to the outgoing line extension end of the AMOLED panel at a position at which the chip IC is disposed.

7. The electronic device according to claim 3, wherein the display apparatus further comprises a copper foil, the copper foil is disposed on a lower surface of the AMOLED panel, and the copper foil is connected to the printed circuit board.

8. A method for manufacturing a display apparatus, comprising:
manufacturing an AMOLED panel and a touch panel, and separately extending an outgoing line of the AMOLED panel and an outgoing line of the touch panel;

fully fitting an AMOLED area of the AMOLED panel to a touch area of the touch panel;

fully fitting cover glass to an upper surface of the touch panel;

fitting a protective layer to a rear side of the AMOLED panel;

performing a thermo compression process on fanout routing on a sector area of the AMOLED panel and fanout routing on the touch panel, bonding an upper surface of a chip IC to the AMOLED panel, and bonding a lower surface of the chip IC to the touch panel;

bending the outgoing line of the AMOLED panel and the outgoing line of the touch panel that are separately bonded with the chip IC to a rear side of a screen, and attaching the outgoing line of the AMOLED panel and the outgoing line of the touch panel to the rear side of the screen by using an adhesive, wherein a bending axis is parallel to a long side of a reserved bending area, to form an integrated display and touch control screen; and connecting an outgoing line extension end of the integrated display and touch control screen to a printed circuit board, to form the display apparatus.

9. The method according to claim 8, wherein a distance from a lower edge of the touch area of the touch panel to the reserved bending area on which the chip IC is bonded to the touch panel is greater than a fanout length of the AMOLED panel.

10. The method according to claim 8, wherein the protective layer comprises foam and a copper foil.

11. The method according to claim 8, wherein before performing the thermo compression process on fanout routing on the sector area of the AMOLED panel, and bonding the upper surface of the chip IC to the AMOLED panel, the method further comprises:

performing a reinforcement process on fanout of the AMOLED panel.

12. The method according to claim 8, wherein before performing the thermo compression process on fanout routing on the touch panel, and bonding the lower surface of the chip IC to the touch panel, the method further comprises:

performing a reinforcement process on fanout of the touch panel.

* * * * *